US006575348B2

United States Patent
Kimura et al.

(10) Patent No.: US 6,575,348 B2
(45) Date of Patent: Jun. 10, 2003

(54) WIRE BONDING APPARATUS WITH SPURIOUS VIBRATION SUPPRESSING STRUCTURE

(75) Inventors: Naoto Kimura, Kumamoto (JP); Hidemi Matsukuma, Kumamoto (JP)

(73) Assignee: NEC Electronics Corporation, Tokyo (JP)

(*) Notice: Subject to any disclaimer, the term of this patent is extended or adjusted under 35 U.S.C. 154(b) by 0 days.

(21) Appl. No.: 10/164,069

(22) Filed: Jun. 6, 2002

(65) Prior Publication Data
US 2002/0185518 A1 Dec. 12, 2002

(30) Foreign Application Priority Data
Jun. 11, 2001 (JP) .................................... 2001-175486

(51) Int. Cl.[7] .................. B23K 1/06; B23K 37/00; B23K 31/02

(52) U.S. Cl. ................... 228/1.1; 228/4.5; 228/110.1; 228/180.5

(58) Field of Search .................. 228/4.5, 180.5, 228/110.1, 1.1; 156/73.1, 73.2, 73.3, 73.4

(56) References Cited

U.S. PATENT DOCUMENTS

| | | | | |
|---|---|---|---|---|
| 4,531,999 A | * | 7/1985 | Persson et al. ........... | 156/580.2 |
| 5,486,733 A | * | 1/1996 | Yamazaki et al. ....... | 310/323.18 |
| 5,540,807 A | * | 7/1996 | Akiike et al. ............ | 156/580.1 |
| 6,135,339 A | * | 10/2000 | Parrini ..................... | 228/1.1 |
| 6,247,628 B1 | * | 6/2001 | Sato et al. ................ | 228/1.1 |
| 6,422,448 B2 | * | 7/2002 | Kyomasu et al. ........ | 228/1.1 |
| 2002/0185518 A1 | * | 12/2002 | Kimura et al. | |
| 2003/0000994 A1 | * | 1/2003 | Kyomasu et al. | |

FOREIGN PATENT DOCUMENTS

JP        2000-340598        12/2000

* cited by examiner

Primary Examiner—Tom Dunn
Assistant Examiner—Kiley Stoner
(74) Attorney, Agent, or Firm—Katten Muchin Zavis Rosenman

(57) ABSTRACT

In a wire bonding apparatus including a horn driver for generating ultrasonic waves, a capillary, an ultrasonic horn formed by a symmetrical section fixed to the horn driver and an asymmetrical section having an end for mounting the capillary, the asymmetrical section is constructed by a spurious vibration suppressing structure for suppressing a vibration component of the ultrasonic horn perpendicular to a propagation direction of the ultrasonic waves with the ultrasonic horn.

4 Claims, 6 Drawing Sheets

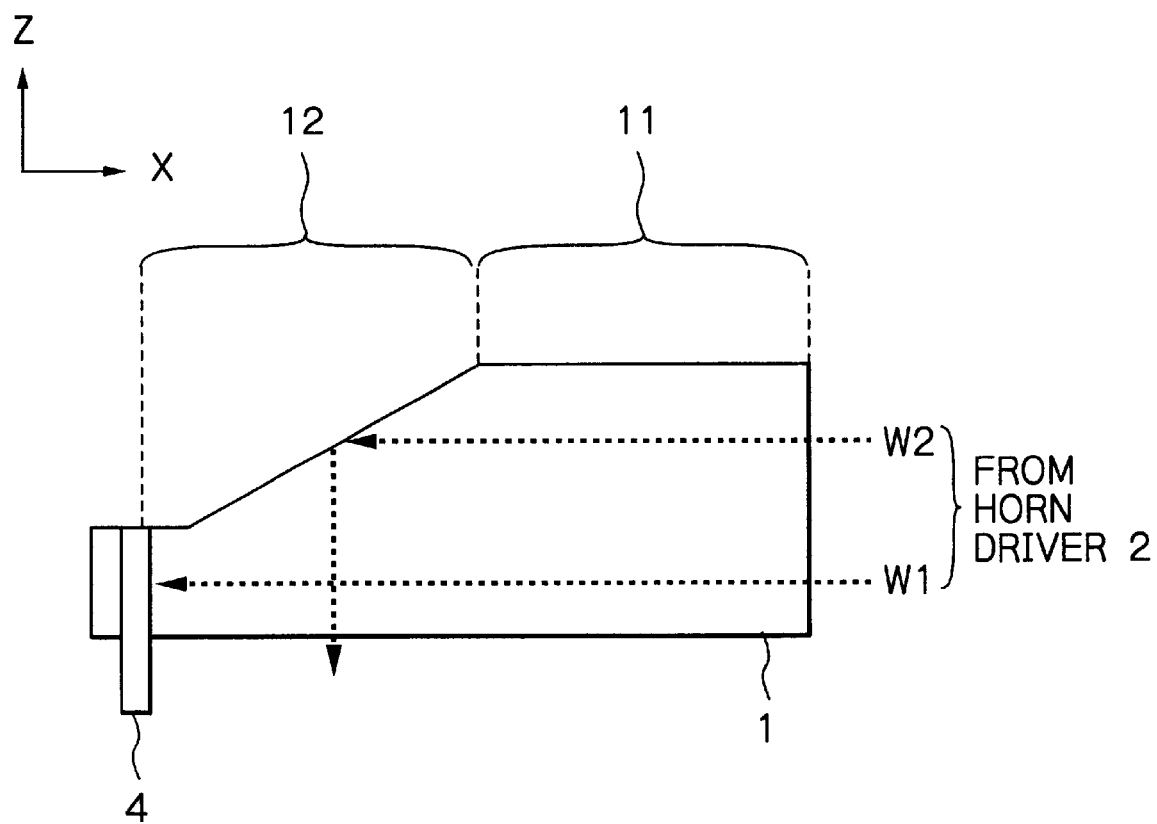

WIRE BONDING APPARATUS WITH SPURIOUS VIBRATION SUPPRESSING STRUCTURE

BACKGROUND OF THE INVENTION

1. Field of the Invention

The present invention relates to a wire bonding apparatus.

2. Description of the Related Art

As wire bonding apparatuses for connecting bonding wires (Au) between bonding pads of semiconductor chips and lead-out terminals of packages, there are a thermopressing type, an ultrasonic thermopressing type and an ultrasonic type. The ultrasonic thermopressing type wire bonding apparatus are widely used in the manufacture of quad flat packages (QFPs) having less than 200 pins.

In an ultrasonic thermopressing type wire bonding apparatus, a bonding pad of a semiconductor chip is heated to about 150 to 300° C., and a gold ball formed by gold wire is pushed down by a capillary onto the bonding pad. Then, ultrasonic waves are performed upon the capillary, so that the gold ball is deformed to break oxide on the bonding pad, thus surely connecting the gold ball to the bonding pad.

The above-mentioned wire bonding apparatus uses an ultrasonic horn for transmitting ultrasonic waves to the capillary. That is, a prior art wire bonding apparatus is constructed by a horn driver for generating ultrasonic waves, a capillary, an ultrasonic horn including a symmetrical section fixed to the horn driver and an asymmetrical section having an end for mounting the capillary (see JP-A-2000-340598). This will be explained later in detail.

In the above-described prior art wire bonding apparatus, however, since the asymmetrical section is tapered, spurious vibration of the capillary occurs so as to reduce the accuracy of the bonding operation.

SUMMARY OF THE INVENTION

It is an object of the present invention to provide a wire bonding apparatus capable of improving the accuracy of the bonding operation.

According to the present invention, in a wire bonding apparatus including a horn driver for generating ultrasonic waves, a capillary, an ultrasonic horn formed by a symmetrical section fixed to the horn driver and an asymmetrical section having an end for mounting the capillary, the asymmetrical section is constructed by a spurious vibration suppressing structure for suppressing a vibration component of the ultrasonic horn perpendicular to a propagation direction of the ultrasonic waves within the ultrasonic horn.

BRIEF DESCRIPTION OF THE DRAWINGS

The present invention will be more clearly understood from the description set forth below, as compared with the prior art, with reference to the accompanying drawings, wherein:

FIG. 2 is a diagram for explaining the problem in the wire bonding apparatus of FIGS. 1A, 1B and 1C;

DESCRIPTION OF THE PREFERRED EMBODIMENTS

Before the description of the preferred embodiments, a prior art wire bonding apparatus will be explained with reference to FIGS. 1A, 1B, 1C and 2.

Figure 1A:
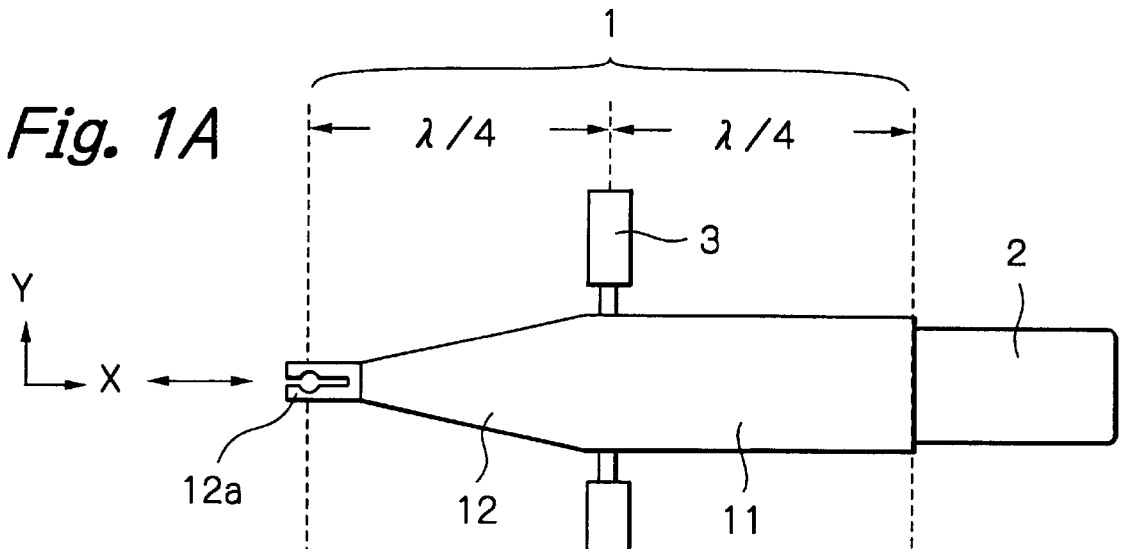
FIG. 1A is a plan view illustrating a prior art wire boding apparatus.
Figure 1B:
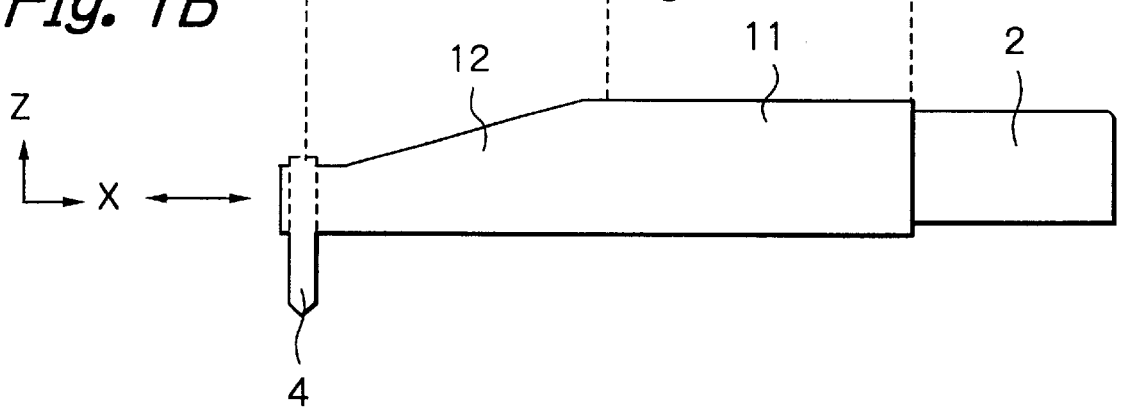
FIG. 1B is a side view of the wire bonding apparatus of FIG. 1A.
Figure 1C:
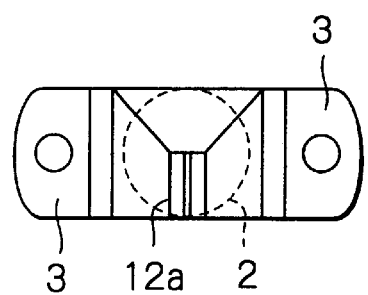
FIG. 1C is a front view of the wire bonding apparatus of FIG. 1A.

FIG. 1A is a plan view illustrating a prior art wire bonding apparatus (see JP-A-2000-340598), FIG. 1B is a side view of the wire bonding apparatus of FIG. 1A, and FIG. 1C a front view of the wire bonding apparatus of FIG. 1A.

As illustrated in FIGS. 1A, 1B and 1C, a wire bonding apparatus is constructed by an ultrasonic horn 1 made of elastic metal fixed to a horn driver 2 for generating ultrasonic waves. The ultrasonic horn 1 is divided into a straight (symmetrical) section 11 and a sloped (asymmetrical) section 12 at a bonder mounting section 3.

The symmetrical section 11 has a cross section which is symmetrical with respect to the Y-direction and the Z-direction, while the asymmetrical section 12 has a cross section which is symmetrical with respect to the Y-direction but asymmetrical with respect to the Z-direction.

A capillary 4 is mounted on a capillary mounting end 12a of the asymmetrical section 12. Note that the capillary 4 is shown in FIG. 1B but not in FIGS. 1A and 1C.

Each of the symmetrical section 11 and the asymmetrical section 12 serves as a $\lambda/4$ resonator where $\lambda$ is a wavelength of ultrasonic waves in the ultrasonic horn 1 ($\lambda \approx 8$ cm).

The asymmetrical section 12 is conically-tapered, exponentially-tapered or catenoidally-tapered, so that the cross section of the asymmetrical section 12 is gradually decreased from the symmetrical section 11 to the capillary 4. As a result, the amplitude of ultrasonic waves propagating within the asymmetrical section 12 is mechanically amplified to apply the ultrasonic waves to the capillary 4.

In the wire bonding apparatus of FIGS. 1A, 1B and 1C, the bottom level of the symmetrical section 11 is the same as that of the asymmetrical section 12, so that a clearance between the ultrasonic horn 1 and an object surface to be bonded can be definite, thus easily carrying out a wire bonding operation.

In the wire bonding apparatus of FIGS. 1A, 1B and 1C, as illustrated in FIG. 2, ultrasonic waves W1 propagate within the symmetrical section 11 and the asymmetrical section 12 and are incident perpendicularly to the capillary 4. As a result, the capillary 4 vibrates along the X-direction. However, ultrasonic waves W2 propagate within the symmetrical section 11 and the asymmetrical section 12 and are incident to a sloped boundary of the asymmetrical section 12. As a result, the asymmetrical section 12 vibrates along the Z-direction as well as along the X-direction, that is, the capillary 4 vibrates along the Z-direction as well as along the X-direction. The vibration of the capillary 4 along the Z-direction is spurious so as to reduce the accuracy of the wire bonding operation.

Figure 3A:
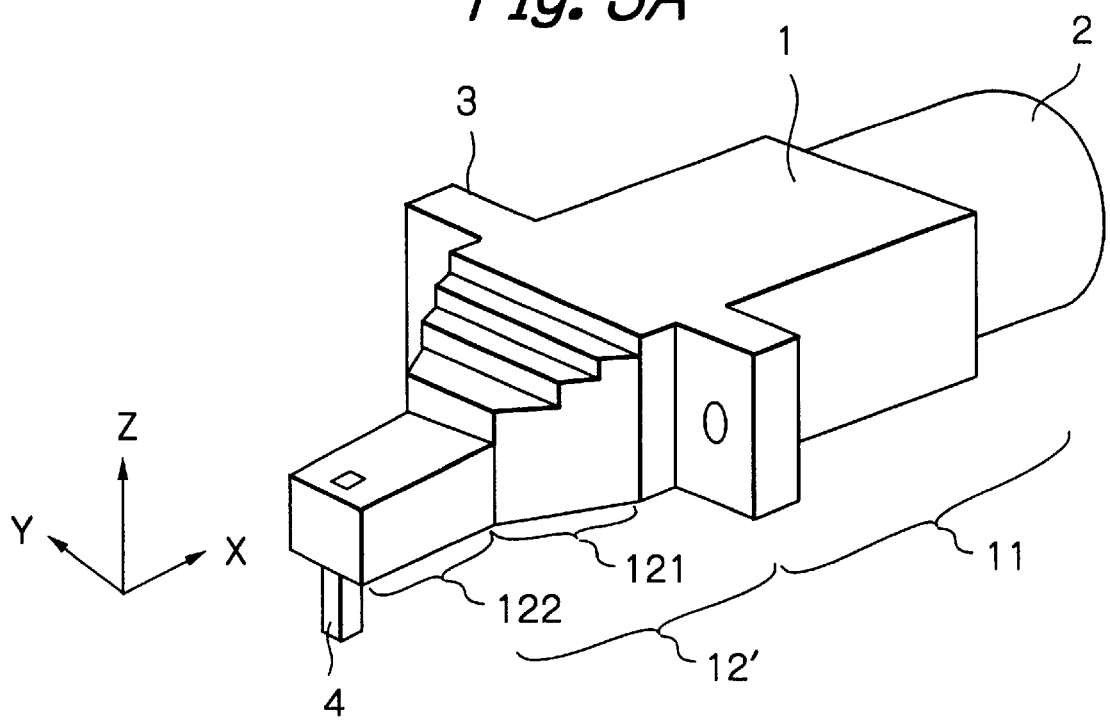
FIG. 3A is a perspective view illustrating a first embodiment of the wire bonding apparatus according to the present invention.
Figure 3B:
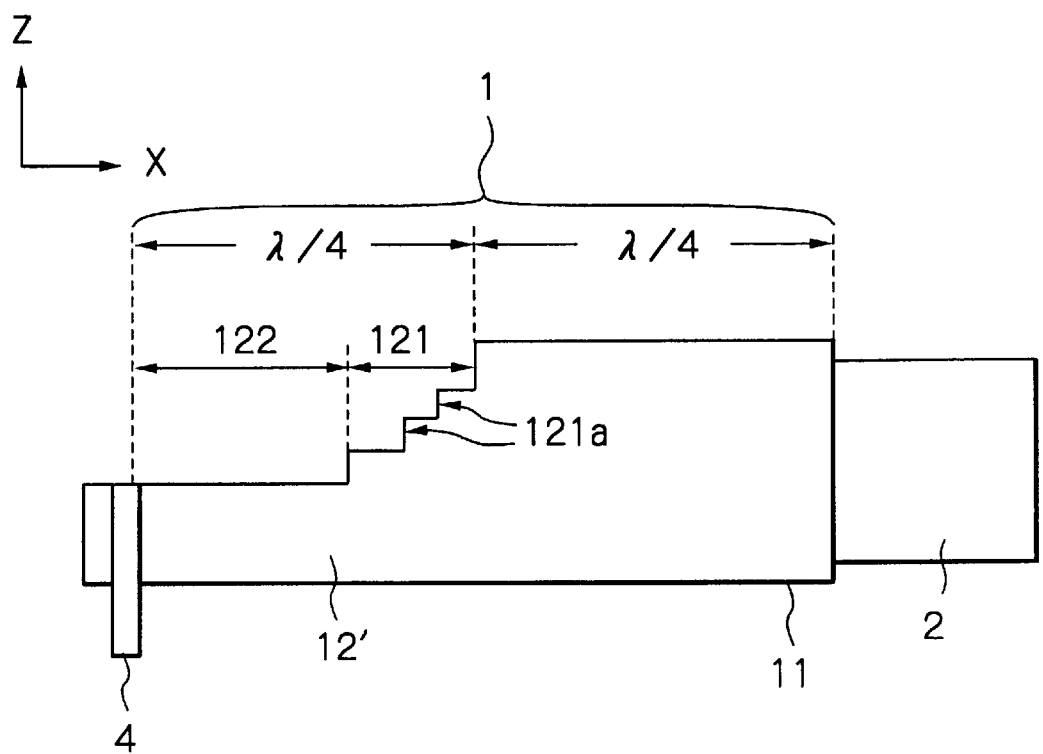
FIG. 3B is a side view of the wire bonding apparatus of FIG. 3A.

FIG. 3A is a perspective view illustrating a first embodiment of the wire bonding apparatus according to the present invention, and FIG. 3B is a side view of the wire bonding apparatus of FIG. 3A. In FIGS. 3A and 3B, the asymmetrical section 12 of FIGS. 1A, 1B and 1C is changed into an asymmetrical section 12' which includes an asymmetrical section 121 and a symmetrical section 122.

The symmetrical section 122 has a cross section which is symmetrical with respect to the Y-direction and the Z-direction. In this case, the cross section of the symmetrical section 122 is smaller than that of the symmetrical section 11. On the other hand, the asymmetrical section 121 has a cross section which is symmetrical with respect to the Y-direction but asymmetrical with respect to the Z-direction.

The cross section of the asymmetrical section 121 is gradually decreased from the symmetrical section 11 to the symmetrical section 122. As a result, the amplitude of ultrasonic waves propagating within the asymmetrical section 121 is mechanically amplified to apply the ultrasonic waves to the capillary 4.

Additionally, stepped grooves 121a are formed on an upper portion of the asymmetrical section 121. Each of the stepped grooves 121a has a face in parallel with the X-direction and a face in parallel with the Z-direction.

Figure 4:
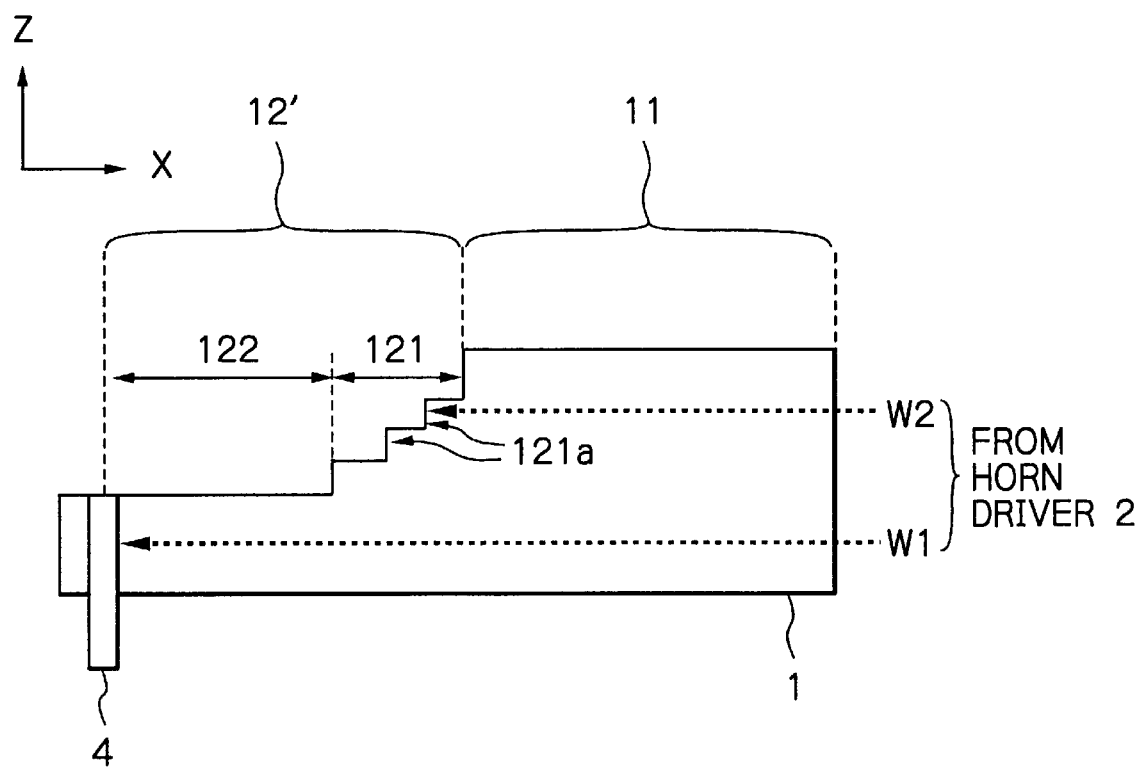
FIG. 4 is a diagram for explaining the effect of the wire bonding apparatus of FIGS. 3A and 3B.

In the wire bonding apparatus of FIGS. 3A and 3B, as illustrated in FIG. 4, ultrasonic waves W1 propagate within the symmetrical section 11 and the asymmetrical section 12' and are incident perpendicularly to the capillary 4. As result, the capillary 4 vibrates along the X-direction. On the other hand, ultrasonic waves W2 propagate within the symmetrical section 11 and the asymmetrical section 121 and are incident to the faces of the asymmetrical section 121 in parallel with the Z-direction. As a result, the asymmetrical section 12 vibrates along the X-direction, that is, the capillary 4 also along the X-direction.

In the above-described first embodiment, both the ultrasonic waves W1 and W2 vibrate the capillary 4 only along the X-direction, in other words, the spurious vibration of the capillary 4 along the Z-direction can be suppressed, thus improving the accuracy of the wire bonding operation.

Figure 5A:
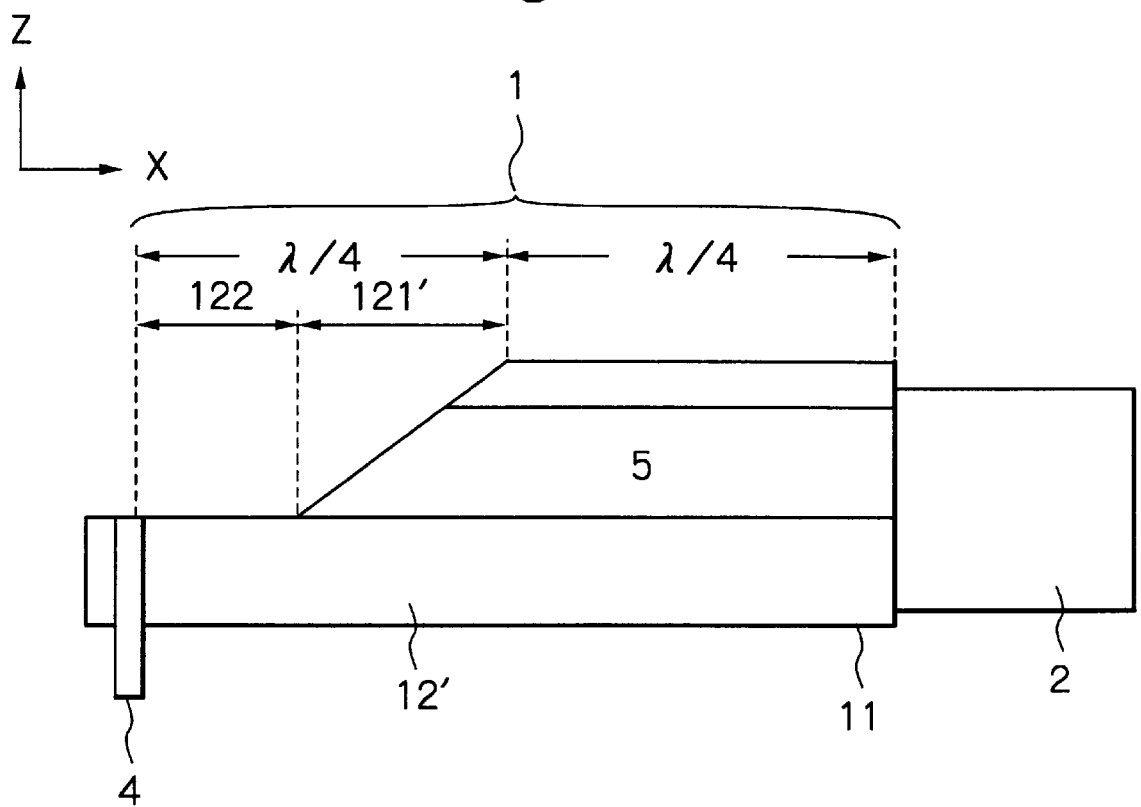
FIG. 5A is a side view illustrating a second embodiment of the wire bonding apparatus according to the present invention.
Figure 5B:
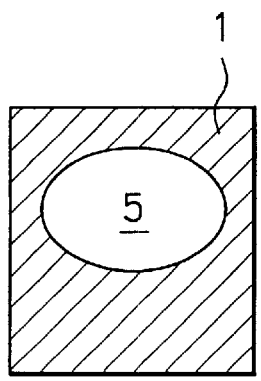
FIG. 5B is a cross-sectional view of the wire bonding apparatus of FIG. 5A.

FIG. 5A is a side view illustrating a second embodiment of the wire bonding apparatus according to the present invention, and FIG. 5B is a side view of the wire bonding apparatus of FIG. 5A. In FIGS. 5A and 5B, the asymmetrical section 121 of FIG. 3A and 3B is changed into an asymmetrical section 121' in which a hollow 5 is formed. Note that the hollow 5 is also formed within the symmetrical section 11.

Even when the hollow 5 is formed within the symmetrical section 11 and the asymmetrical section 121', the ultrasonic horn 1 has a sufficient rigidity, and accordingly, the wire bonding apparatus can be small in weight.

Figure 6:
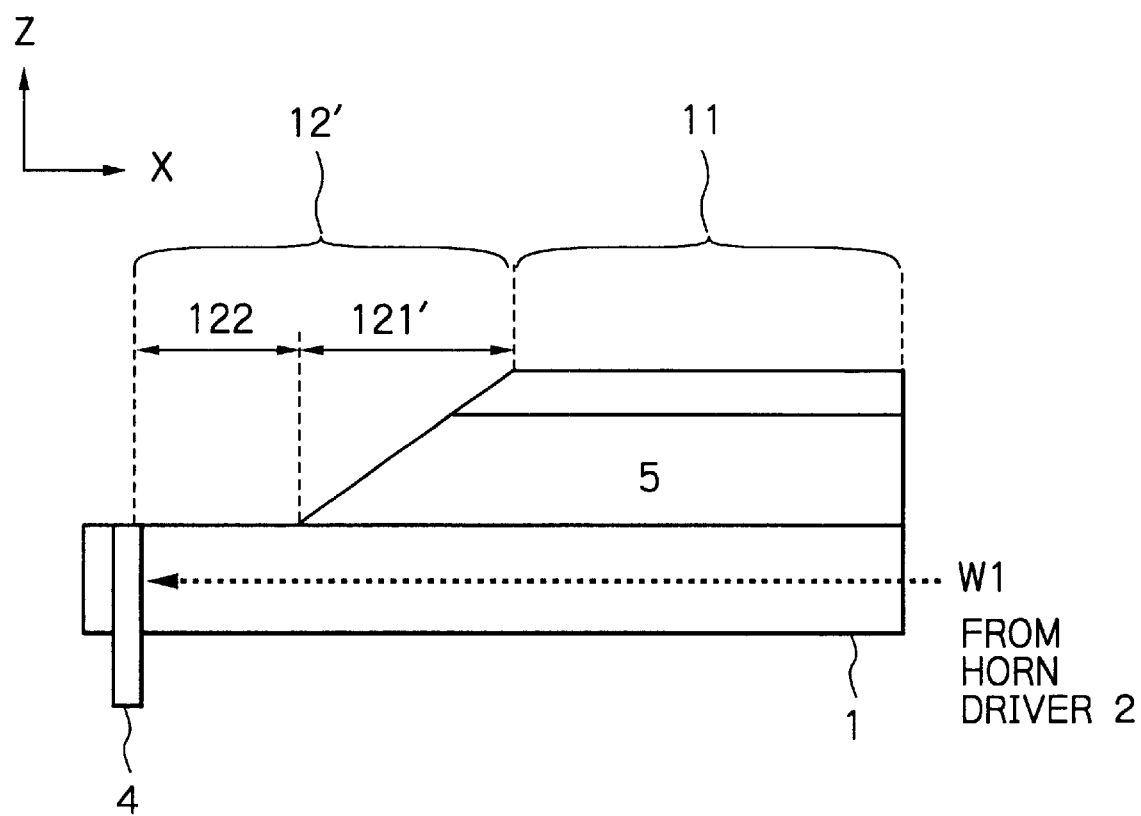
FIG. 6 is a diagram for explaining the effect of the wire bonding apparatus of FIGS. 5A and 5B.

In the wire bonding apparatus of FIGS. 5A and 5B, as illustrated in FIG. 6, ultrasonic waves W1 propagate within the symmetrical section It and the asymmetrical section 12' and are incident perpendicularly to the capillary 4. As result, the capillary 4 vibrates along the X-direction. On the other hand, there are no ultrasonic waves W2 as shown in FIG. 4. In other words, the spurious vibration of the capillary 4 along the Z-direction can also be suppressed, thus improving the accuracy of the wire bonding operation.

The present invention can be applied to an ultrasonic type wire bonding apparatus as well as an ultrasonic thermopressing type wire bonding apparatus.

As explained hereinabove, according to the present invention, since spurious vibration of the capillary can be suppressed, the accuracy of wire bonding operation can be improved.

What is claimed is:

1. A wire bonding apparatus comprising:

a horn driver for generating ultrasonic waves;

a ultrasonic horn including a symmetrical section fixed to said horn driver and an asymmetrical section having an end for mounting a capillary, said asymmetrical section comprising a spurious vibration suppressing structure for suppressing a spurious vibration component of said ultrasonic horn perpendicular to a propagation direction of said ultrasonic waves with said ultrasonic horn.

2. The apparatus as set forth in claim 1, wherein stepped grooves are formed on a portion of said asymmetrical section, thus forming said spurious vibration suppressing structure.

3. The apparatus as set forth in claim 1, wherein each of said stepped grooves is formed by one face in parallel with the propagation direction of said ultrasonic waves and one face perpendicular to the propagation direction of said ultrasonic waves.

4. The apparatus as set forth in claim 1, wherein a hollow is formed within said symmetrical section and said asymmetrical section, thus forming said spurious vibration suppressing structure.

* * * * *